United States Patent [19]
Moriwaki et al.

[11] Patent Number: 5,233,638
[45] Date of Patent: Aug. 3, 1993

[54] TIMER INPUT CONTROL CIRCUIT AND COUNTER CONTROL CIRCUIT

[75] Inventors: Shohei Moriwaki; Shinichi Hirose, both of Hyogo, Japan

[73] Assignee: Mitsubishi Denki Kabushiki Kaisha, Tokyo, Japan

[21] Appl. No.: 870,445

[22] Filed: Apr. 16, 1992

[30] Foreign Application Priority Data

Apr. 18, 1991 [JP] Japan ................... 3-114015

[51] Int. Cl.⁵ ............................................. H03K 17/16
[52] U.S. Cl. ...................................... 377/55; 377/111; 377/115; 377/116; 307/272.2
[58] Field of Search ................ 377/55, 111, 115, 116; 307/272.2

[56] References Cited

U.S. PATENT DOCUMENTS

| | | | |
|---|---|---|---|
| 4,746,915 | 5/1988 | Sekiya | 377/115 |
| 4,761,801 | 8/1988 | Underwood | 377/55 |
| 4,940,909 | 7/1990 | Mulder et al. | 377/64 |
| 4,968,906 | 11/1990 | Pham et al. | 377/55 |
| 4,974,241 | 11/1990 | McClure et al. | 377/116 |
| 5,077,764 | 12/1991 | Yamashita | 377/116 |
| 5,130,568 | 7/1992 | Miller et al. | 307/272.1 |

*Primary Examiner*—William L. Sikes
*Assistant Examiner*—Scott A. Ouellette
*Attorney, Agent, or Firm*—Townsend and Townsend

[57] ABSTRACT

A circuit having a delay circuit provided with a gate for converting the output signal of an SR flip-flop into a signal with a delay equal to or more than the clock pulse width enough for count operation and leading the logical addition between the signal and system clock and the logical multiplication between the signal and counter write signal to the direct reset input of a transparent latch 7 and for realizing read-on-the-fly or write-on-the-fly operation even if timer input does not synchronize with the system clock.

6 Claims, 8 Drawing Sheets

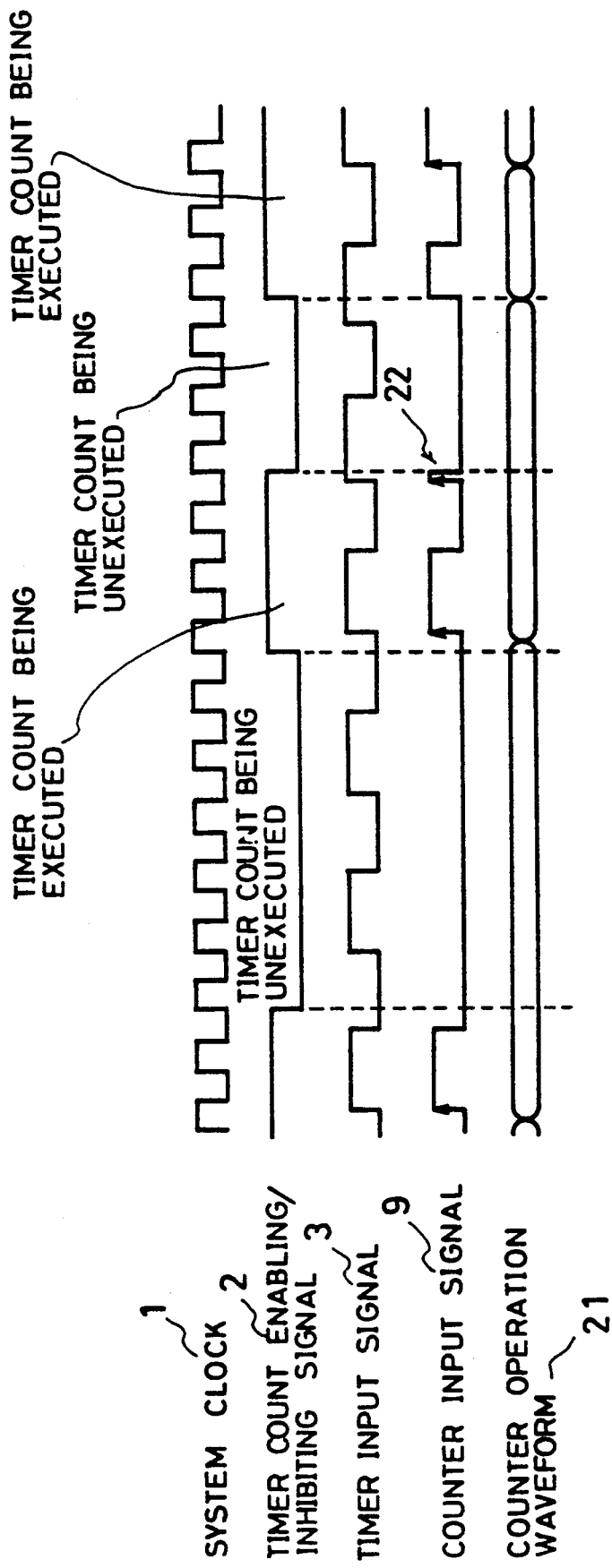

TIMER INPUT CONTROL CIRCUIT AND COUNTER CONTROL CIRCUIT

BACKGROUND OF THE INVENTION

1. Field of the Invention

The present invention relates to a timer input control circuit and its counter control circuit, particularly to a circuit allowing read-on-the-fly and write-on-the-fly operations of counter values even if the timer input signal does not synchronize with the system clock.

2. Description of the Prior Art

FIG. 7 shows the configuration of a timer input control circuit according to the prior art, in which numeral 2 is a timer count enabling/inhibiting signal, 3 is a timer input signal, and 9 is a counter input signal.

FIG. 8 shows the timer count operation waveform of the above timer input control circuit, in which numeral 1 is system clock, 2 is a timer count enabling/inhibiting signal, 3 is a timer input signal, 9 is a counter input signal, 21 is a counter operation waveform, and 22 is a spike-shaped counter input signal.

The following is the description of operations. First, the timer input signal is input and then supplied to the counter as the counter input signal only when the timer count enabling/inhibiting signal is effective. Therefore, when the timer count enabling/inhibiting signal is inhibited immediately after the timer input signal rises, the spike-shaped counter input signal is generated as shown by numeral 22 in FIG. 8.

For the conventional timer using a ripple counter, the above spike-shaped timer count signal is influenced only by the least significant bit of the timer counter when the count input signal does not synchronize with the system clock. However, a count value error has no problem for practical use. In this case, read-on-the-fly operation of timer count values cannot be executed because each bit change timing of the ripple counter differs.

Even if a read register is installed and a count source and read control signal are controlled from being transferred to the read register by an SR flip-flop, the upper limit of the operating frequency lowers if the counter has a lot of bits. Also, because the spike-shaped signal is given to the count source, there are problems that the above flip-flop operation is unstable and so on. Therefore, the purpose of the conventional timer is restricted.

To realize the read-on-the-fly operation, a synchronous counter to simultaneously update all bits at the time of counting is used. However, if the count input control circuit shown in FIG. 7 is used to switch the enabling/inhibiting operation of the counter, count values may greatly vary because the above spike-shaped pulse is input to the clock at each stage of the synchronous counter. Therefore, normal counting cannot be made if the counter input signal does not synchronize with the operation of the input control circuit. That is, it is necessary to sample the counter input signal by the system clock for driving the input control circuit and synchronize it. Therefore, it is impossible to use the frequency of the counter input signal higher than that of the system clock. Thus, for the conventional timer having the read-on-the-fly function, it is impossible to count or stop the timer input signal with the frequency higher than that of the system clock when enabling or inhibiting the counter operation.

SUMMARY OF THE INVENTION

The present invention is made to solve the above problems, and it is an object of this invention to provide a timer input control circuit not for varying count values by generating no spike-shaped pulse and a counter control circuit capable of using the counter input signal with the frequency higher than that of a system clock without synchronizing the counter input signal with the system clock and allowing the read-on-the-fly and write-on-the-fly operations of the counter.

The timer input control circuit related to the first invention of the present invention has a transparent latch provided with direct reset for leading a timer input signal to the data input; three inputs; and SR flip-flop in which the counter write signal is given to the first S input, the count enabling/inhibiting signal consisting of binary signal for count enabling and count inhibiting is given to the second S input, and the above timer input signal is given to R input whose output is led to the gate input of the above transparent latch; and a delay circuit provided with a gate for converting the SR flip-flop output signal into a signal with a delay equal to or more than the clock pulse width enough for count operation and leading the logical addition between the signal and system clock and the logical multiplication between the signal and the above counter write signal to the direct reset input of the above transparent latch.

The counter control circuit related to the second invention of the present invention is added to the above timer input control circuit, which comprises a counter to which the counter input signal or the output of the transparent latch of the timer input control circuit is input, a reload register for setting the initial value of the above counter according to the above counter write signal, a read register for inputting the value of the above counter and outputting it to a data bus, and an SR flip-flop for controlling the latch of the above read register according to the above counter input signal and counter read signal.

In addition, the timer input control circuit related to the third invention of the present invention has a transparent latch provided with direct reset for leading a timer input signal to the data input; two inputs; an SR flip-flop in which the count enabling/inhibiting signal consisting of binary signal for count enabling and count inhibiting is given to S input and the above timer input signal is given to R input whose output is led to the gate input of the above transparent latch; and a delay circuit provided with a gate for converting the SR flip-flop output signal into a signal with a delay equal to or more than the clock pulse width enough for count operation and leading the logical addition between the signal and system clock to the direct reset input of the above transparent latch.

According to the timer input control circuit of the first and third inventions, no spike-shaped counter input signal is generated.

According to the counter control circuit of the second invention, it is unnecessary to synchronize the counter input signal with the system clock.

The above and other objects, features, and advantages of the invention will become more apparent from the following description when taken in conjunction with the accompanying drawings.

BRIEF DESCRIPTION OF THE DRAWINGS

FIG. 8 is a diagram showing the count operation waveform of the timer according to the prior art.

DESCRIPTION OF THE PREFERRED EMBODIMENT

The following is the description of the embodiment of the present invention according to the drawings.

Figure 1:
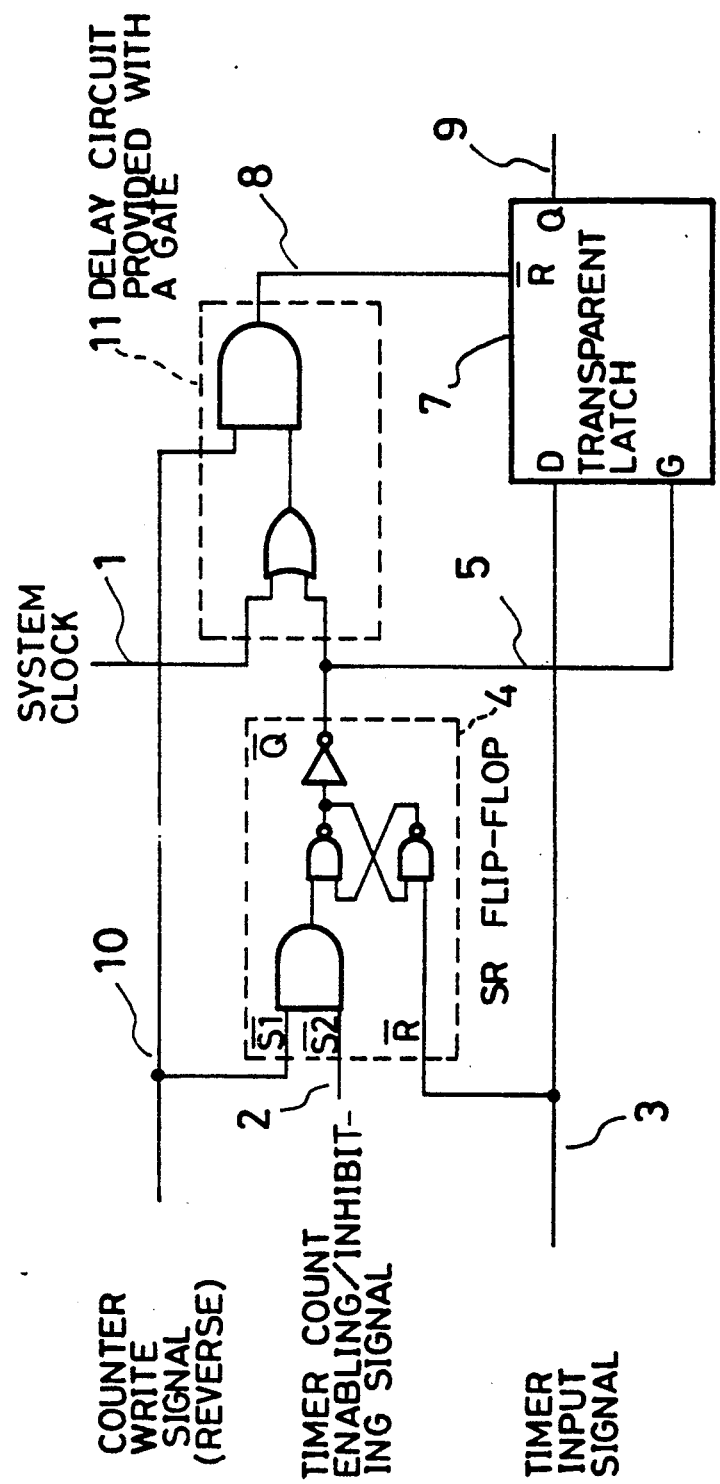
FIG. 1 is a block diagram showing an embodiment of the timer input control circuit according to the present invention.

FIG. 1 is a block diagram of the timer input control circuit according to the first invention of the present invention, in which numeral 1 is a system clock, 2 is a timer count enabling/inhibiting signal which changes synchronously with the system clock 1, 3 is a timer input signal, 4 is an SR flip-flop, 5 is a transparent-latch gate input signal, 7 is a transparent latch, 8 is a transparent-latch reset input signal, 9 is a counter input signal serving as the input of the counter circuit, 10 is a reverse signal of the counter write signal, and 11 is a delay circuit provided with a gate.

The following is the more-detailed description of the above circuit.

That is, the circuit has a transparent latch 7 provided with direct reset for leading a timer input signal 3 to the data D input; three inputs; an SR flip-flop 4 in which the reverse signal of the counter write signal is given to the first S1 input, a count enabling/inhibiting signal 2 consisting of binary signal for count enabling and count inhibiting given to the second S2 input, and the above timer input signal is given to R input whose output (transparent latch gate input signal) is led to the gate G input of the above transparent latch 7; and a delay circuit 11 provided with a gate for converting the output signal of the SR flip-flop 4 into a signal with a delay equal to or more than the clock pulse width enough for count operation and leading the logical addition between the signal and system clock 1 and the logical multiplication between the signal and the above counter write signal to the direct reset input of the above transparent latch 7.

Figure 2:
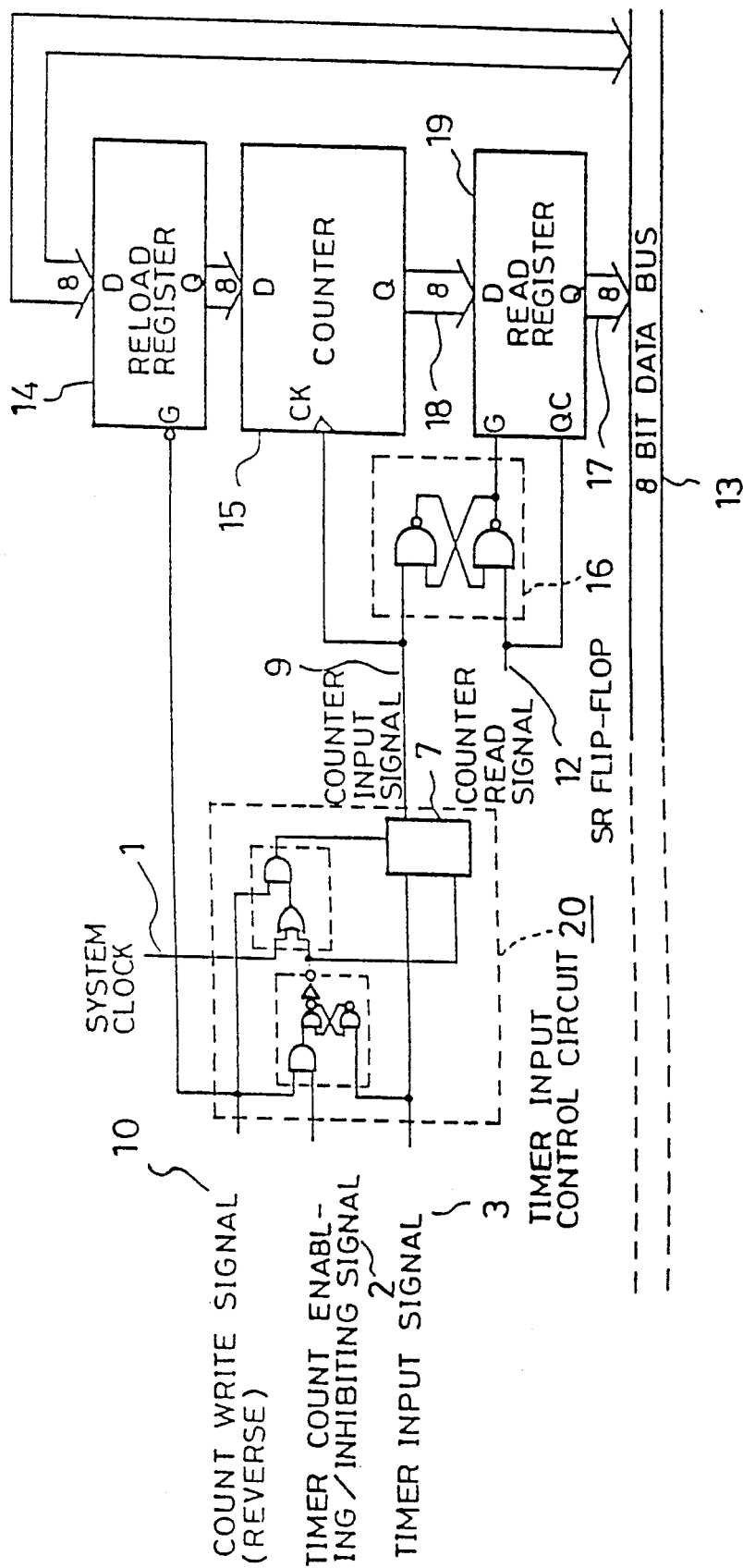
FIG. 2 is a block diagram showing an embodiment of the counter control circuit including the timer input control circuit in FIG. 1 according to the present invention.

FIG. 2 shows a block diagram of the counter control circuit including the timer input control circuit in FIG. 1 according to the second invention of the present invention, in which numeral 1 is a system clock, 2 is a timer count enabling/inhibiting signal which changes synchronously with the system clock 1, 3 is a timer input signal, 9 is a counter input signal which is the output of the transparent latch 7 of the above timer input control circuit, 10 is a reverse signal of the counter write signal which changes synchronously with the system clock 1, 12 is a counter read signal which changes synchronously with the system clock 1, 13 is an 8-bit data bus, 14 is a reload register consisting of an 8-bit transparent latch for setting the initial value of a counter 15, 15 is a rise-active timer counter which requires that the counter input signal is set to "0" for setting, 16 is an SR flip-flop for controlling the latch of a read register 19, 17 is a read-register output signal, 19 is a read register which consists of an 8-bit transparent latch and a three-state output buffer and fetches the value of the counter 15, and 20 is the timer input control circuit in FIG. 1.

Figure 3:
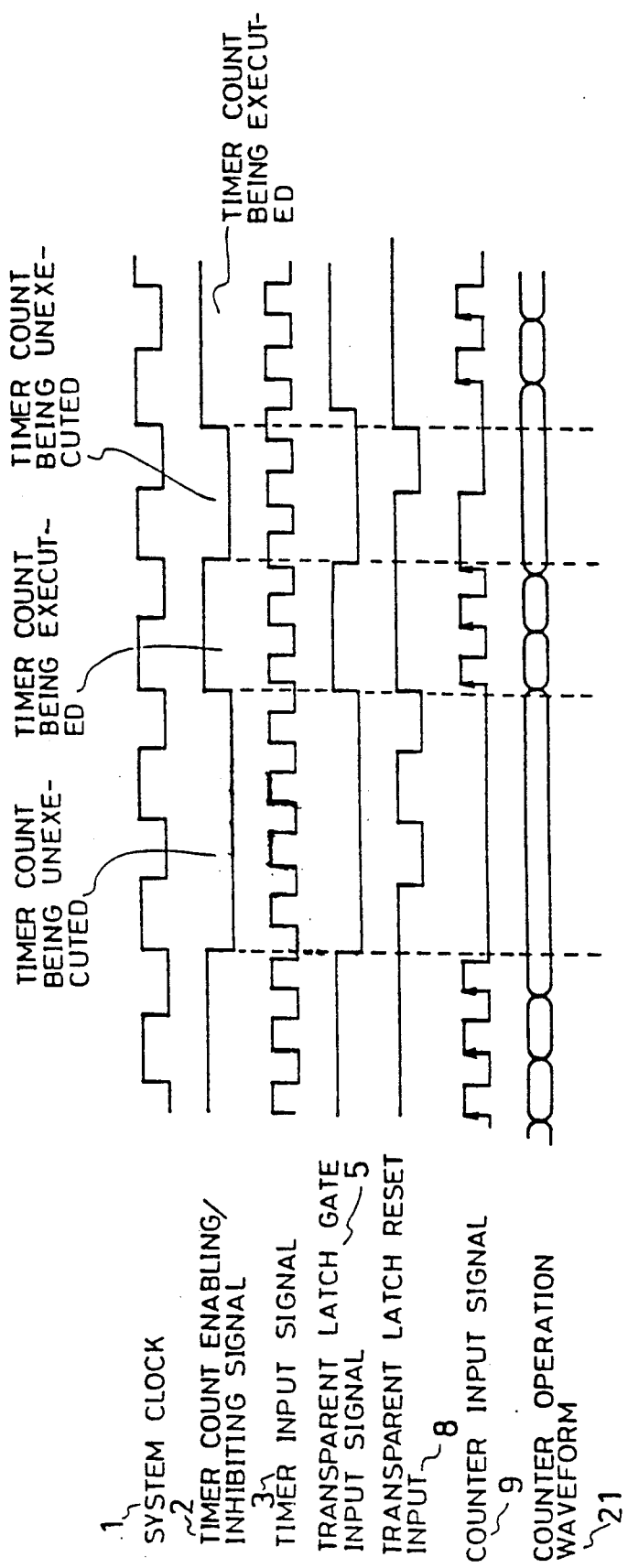
FIG. 3 is a diagram showing the count operation waveform of the timer of an embodiment of the timer input control circuit according to the present invention.
Figure 4:
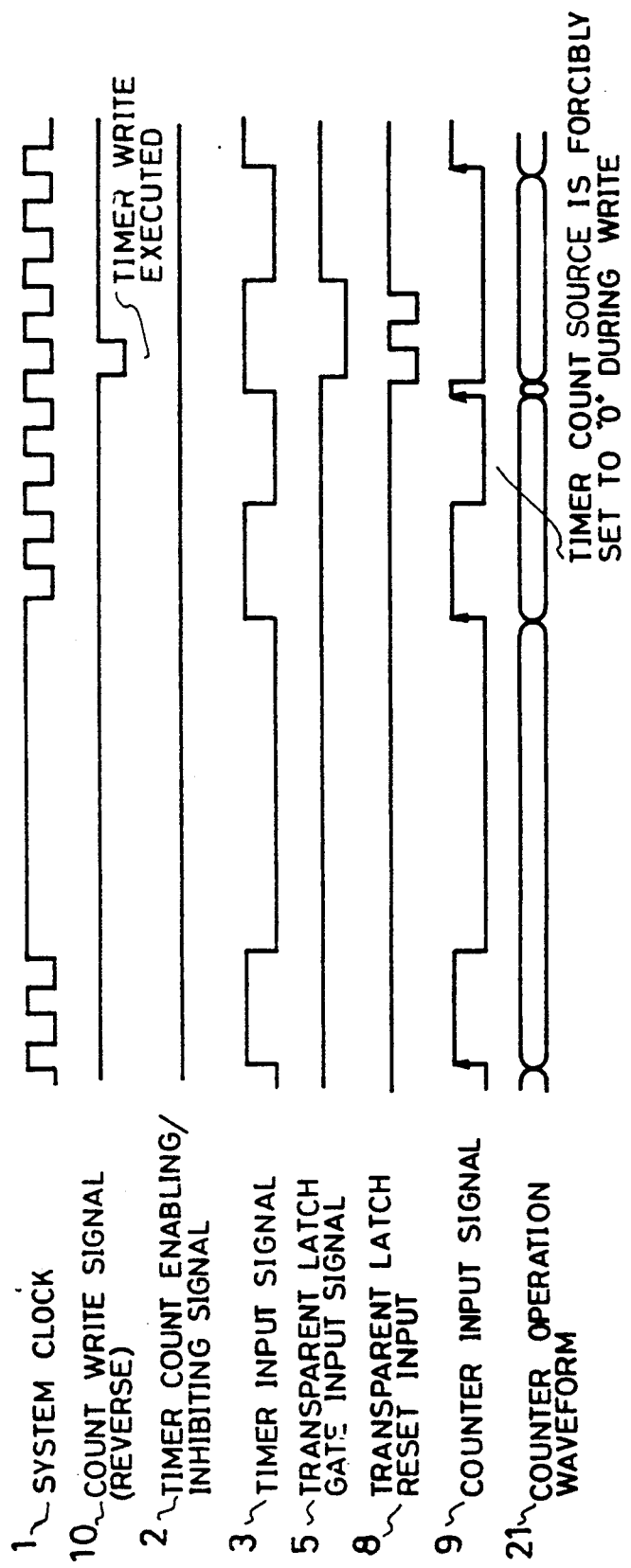
FIG. 4 is a diagram showing the count operation waveform of the timer of an embodiment of the timer input control circuit according to the present invention when the timer input signal does not synchronize with the system clock.
Figure 5:
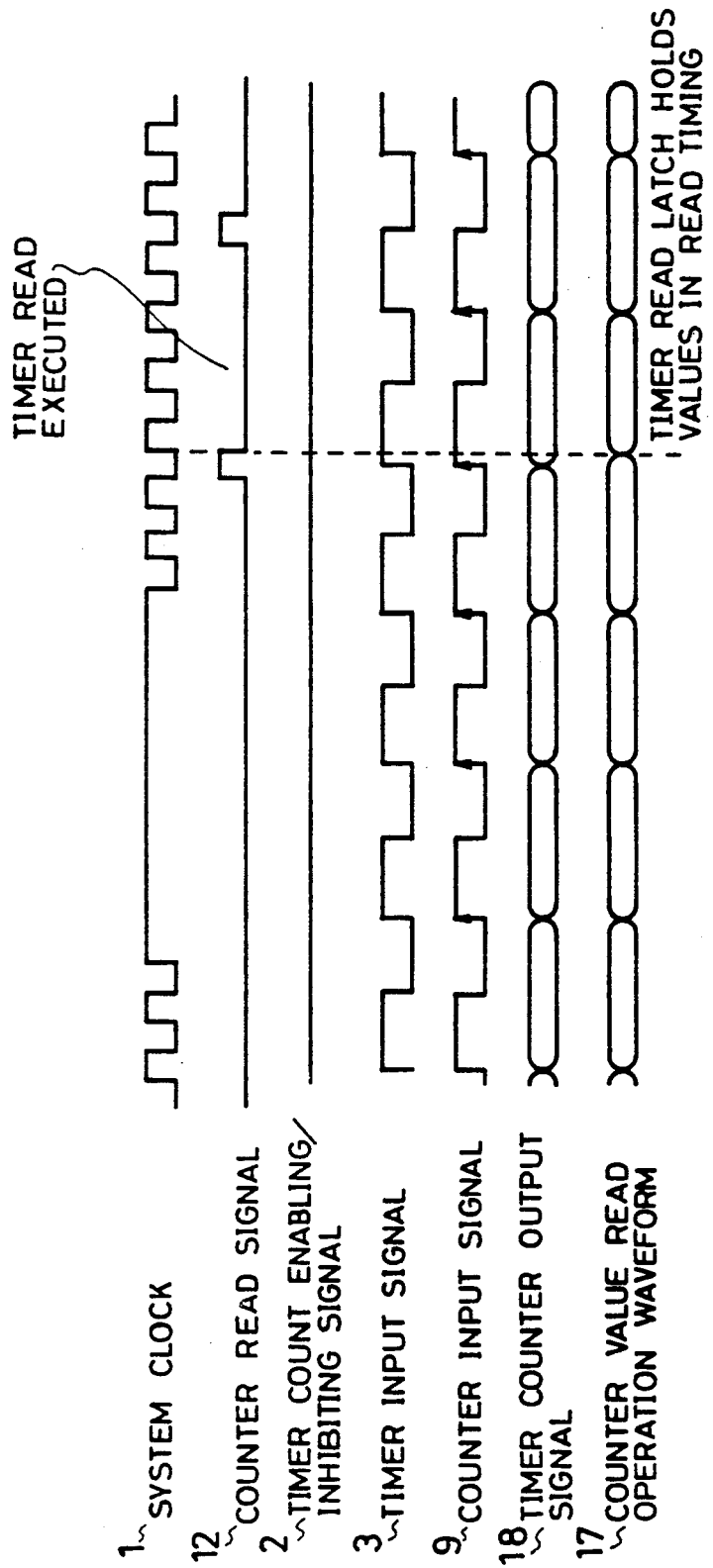
FIG. 5 is a diagram showing the count-value read-on-the-fly operation waveform of the timer of an embodiment of the counter control circuit according to the present invention.

The following is the description of the operation of the timer control circuit shown in FIG. 1 and that of the counter control circuit in FIG. 2 including the timer input control circuit according to FIGS. 1 and 2 and the timing charts in FIGS. 3 through 5. First, the case is considered in which no data is written in the counter 15. In FIG. 1, the counter write signal (reverse) 10 is considered to be always "1" (FIG. 4).

Then, when the timer count enabling/inhibiting signal 2 comes to "0" synchronously with the rise of the system clock 1, timer count is inhibited. As a result, the output of the SR flip-flop 4 or the transparent latch gate input signal 5 comes to "0" and the transparent latch 7 is latched. Also, the output of the delay circuit 11 provided with a gate or the direct reset input 8 of the transparent latch 7 comes to "1" while the system clock 1 is set to "1". However, because the input 8 comes to "0" when the system clock comes to "0", the output of the transparent latch 7 or the counter input signal 9 comes to "0" when the direct reset input comes to "0". However, if the timer input signal 3 is set to "0" at the moment the timer count enabling/inhibiting signal falls, the output of the transparent latch 7 or the counter input signal 9 comes to "0" from the beginning.

Then, when the timer count enabling/inhibiting signal 2 comes to "1" synchronously with the rise of the system clock 1, timer counter is enabled. The output of the SR flip-flop 4 (transparent latch gate input signal 5) comes to "1" when the timer input signal 3 comes to "0", and the transparent latch 7 is brought under the transparent state. In this case, however, the direct reset input 8 of the transparent latch always comes to "1" but it is not reset when the output 5 of the SR flip-flop 4 is set to "1".

Thus, because the counter input signal 9 always rises synchronously with the rise of the timer input signal 3 when timer count is enabled, and the transparent latch reset input 8 is set to "1" until the next system clock 1 falls when timer count is inhibited immediately after the timer input signal 3 rises; the pulse width equal to or more than the period of "1" of the system clock 1 is always obtained. Therefore, no spike-shaped counter input signal is generated. This state is shown by the timing chart in FIG. 3.

The case in which values are written in the counter 15 is described below according to the timing charts in FIGS. 4 and 5. The counter write signal (reverse) 10 is set to "0" to write values in the counter 15. In this case, the direct reset input 8 of the transparent latch 7 and the gate input 5 immediately come to "0" and the counter input signal 9 also comes to "0". When the write signal is reset, the timer count inhibiting state after the system clock 1 falls continues if the timer count inhibiting state is set at that time but the state immediately after the timer count enabling state is set if the timer count enabling state is set at that time.

The count operation is described below. The counter input signal 9 is controlled according to the timer count enabling/inhibiting signal 2 and the timer input signal 3. The spike-shaped "1" pulse causing malfunction of the counter 15 does not appear in the signal 9. Or the spike-shaped "0" pulse causing malfunction of the timer 15 does not appear in the counter input signal 9 because the timer count enabling/inhibiting signal 2 and the counter write signal 10 synchronize with the system clock 1. Therefore, the counter 15 normally operates. If counter overflow occurs, the counter fetches value from the reload register 14 and continues counting.

The counter read operation is described below. Under states other than read state, the counter read signal 12 is set to "0", the read register 19 is set to the latest value, and the output buffer of the register 19 is disabled. When counter read operation starts, the counter read signal 12 comes to "1" and the output buffer of the read register 19 is enabled. In this case, if the counter input signal 9 is set to "0", the output of the SR flip-flop 16 comes to "0" and the transparent latch of the read register 19 is latched. If the counter input signal 9 is set to "1" when the counter read operation starts, the SR flip-flop 16 outputs "1" until the counter input signal comes to "0". The counter 15 stably outputs data values while the counter input signal is set to "1" even if the transparent latch of the read register 19 is under the transparent state because counting does not advance at the fall of the counter input signal 9. If the counter input signal 9 is set to "0", stable read is executed because output data values do not change even if the counter input signal 9 rises any time. Thus, the read-on-the-fly function capable of reading normal values is realized even during counter read. When the counter read signal 12 returns to "0", the output buffer of the read register 19 is disabled again and the transparent latch is immediately brought under the transparent state. Thus, counter read operation is completed.

FIG. 3 shows a timer count operation waveform of the embodiment of the timer input control circuit according to the present invention, in which numeral 1 is a system clock, 2 is a timer count enabling/inhibiting signal which changes synchronously with the system clock 1, 3 is a timer input signal, 5 is a transparent latch gate input signal, 8 is a transparent latch reset input signal, 9 is a counter input signal, and 21 is a counter operation waveform.

FIG. 4 shows counter operation and write operation waveform of the timer when the timer input signal does not synchronize with the system clock in the embodiment of the timer input circuit according to the present invention, in which numeral 1 is a system clock, 2 is a timer count enabling/inhibiting signal which changes synsynchronously with the system clock 1, 3 is a timer input signal, 5 is a transparent latch gate input signal, 8 is a transparent latch reset input signal, 9 is a counter input signal, 10 is a reverse signal of the counter write signal, and 21 is a counter operation waveform.

FIG. 5 shows a counter-value read operation waveform of the timer of the embodiment according to the present invention, in which numeral 1 is a system clock, 2 is a timer count enabling/inhibiting signal which changes synchronously with the system clock 1, 3 is a timer input signal, 9 is a counter input signal, 12 is a counter read signal which changes synchronously with the system clock 1, 17 is a read register output signal, and 18 is a counter read signal.

For the embodiment in FIG. 2, the counter input signal should be set to "0" to set a value to the 8-bit counter 15. However, when a counter not requiring the counter input signal set to "0" is used, it is unnecessary to control the timer input control circuit in FIG. 2 by the counter write signal (reverse). This operation of the timer input control circuit is the same as the operation when on data is written in the counter of the circuit in FIG. 2. Therefore, FIG. 6 shows the configuration of a simplified timer input control circuit.

Figure 6:
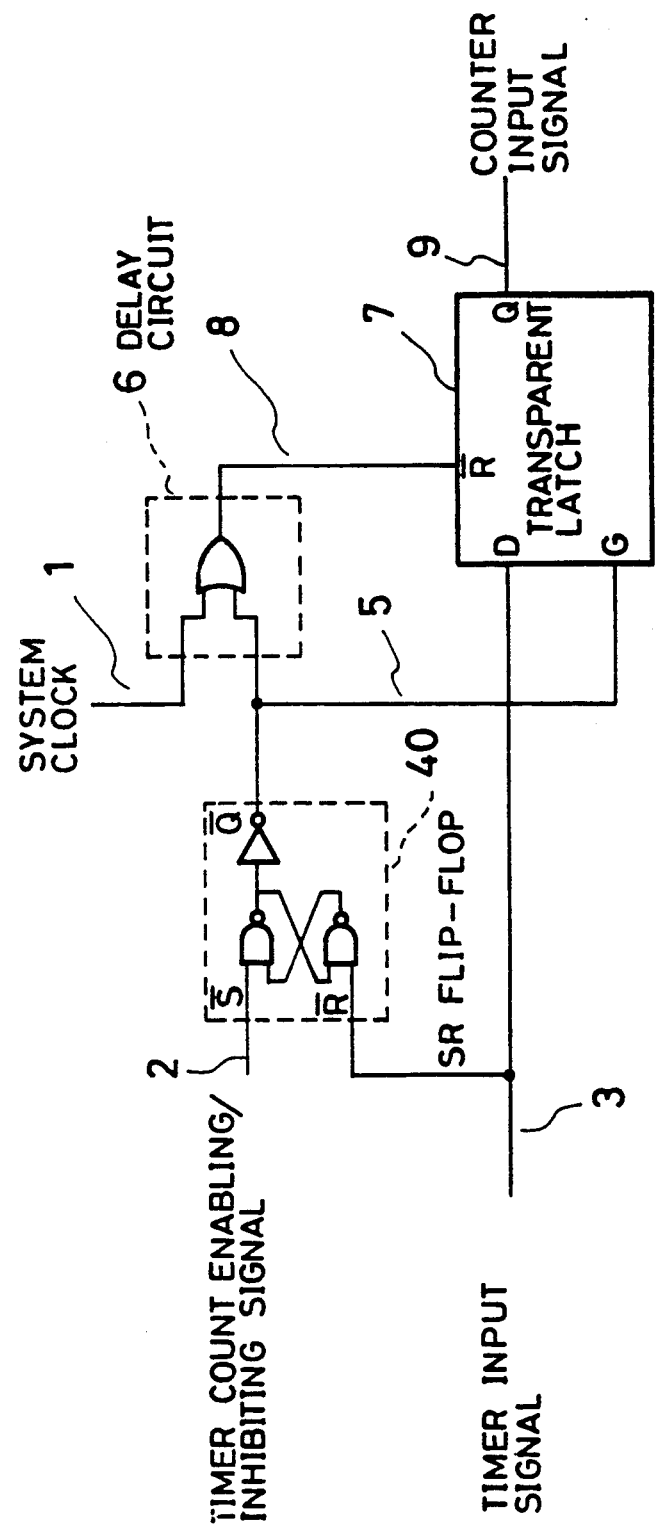
FIG. 6 is a block diagram showing another embodiment of the timer input control circuit according to the present invention.
Figure 7:
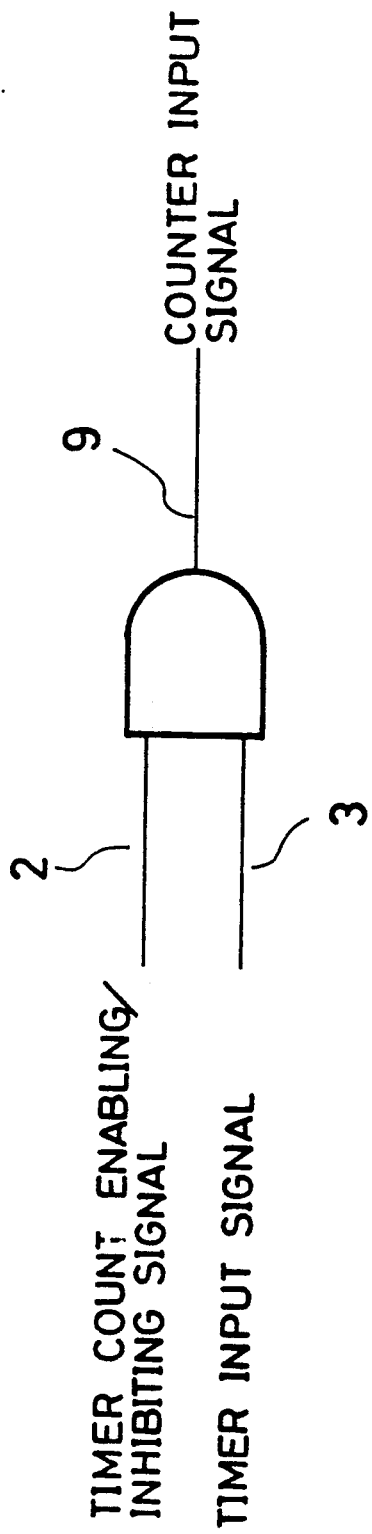
FIG. 7 is a diagram showing the configuration of a timer input control circuit according to the prior art.

FIG. 6 is a block diagram showing another embodiment of the timer input control circuit according to the present invention, in which numeral 1 is a system clock, 2 is a timer count enabling/inhibiting signal which changes synchronously with the system clock 1, 3 is a timer input signal, 40 is an SR flip-flop, 5 is a transparent latch gate input signal, 6 is a delay circuit for producing a delay equal to or more than the clock pulse width enough for count operation, 7 is a transparent latch, 8 is a transparent latch reset input signal, and 9 is a counter input signal.

This circuit is described below in detail.

That is, the circuit has a transparent latch 7 provided with direct reset for leading a timer input signal 3 to the data D input; two inputs; an SR flip-flop 40 in which the count enabling/inhibiting signal 2 consisting of binary signal for count enabling and count inhibiting is given to S input and the above timer input signal 3 is given to R input whose output is led to the gate G input of the above transparent latch 7; and a delay circuit 6 provided with a gate for converting the SR flip-flop output signal into a signal with a delay equal to or more than the clock pulse width enough for count operation and leading the logical addition between the signal and system clock to the direct reset R input of the above transparent latch 7.

The description of operation is omitted because the operation is the same as that of the circuit in FIG. 1.

Though the delay of the fall timing of counter input signal is obtained using the system clock for the above embodiment, it is also possible to use a timer input control circuit provided with a delay circuit.

Also for the above embodiment, the timer- and counter-input signals use the type which operates at the rise, the counter write signal is "0" active, the counter read signal is "1" active, and the timer count enabling/inhibiting signal is enabled for "1" and inhibited for "0". However, the polarity is not specified and both the positive and negative logics can be used.

Though the above embodiment uses an 8-bit counter and 8-bit bus, it is also possible to use a counter and bus of any other bits.

Though not specified in the above embodiment, it is possible to use, for example, a ripple-carry type asynchronous counter as well as the synchronous counter generally used for read-on-the-fly operation.

As described above, according to the timer input control circuit of the first and third inventions of the present invention, the disadvantage that count values vary can be eliminated because no spike-shaped pulse is output. And, according to the counter control circuit including the above timer input control circuit of the second invention, it is unnecessary to synchronize the counter input signal with the system clock and it is possible to use the counter input signal frequency higher than that of the system clock and realize the read-on-the-fly operation even if the timer input signal does not synchronize with the system clock.

What is claimed is:

1. A timer input control circuit configured to accept a timer count enabling/inhibiting signal that is synchronized with a system clock and a timer input signal that is not synchronized with the system clock, and configured to output a counter input signal that is always of sufficient duration to be recognized as a count input to a counter, said timer input control circuit comprising:

a transparent latch having a data input to receive the timer input signal; a gate input to latch said transparent latch when the timer count enabling/inhibiting signal is inhibited and unlatch said transparent latch, thus putting it in transparent mode, when the timer count enabling/inhibiting signal is enabled and the timer input signal is inactive, thus eliminating voltage spikes that could cause timer malfunction; an output for transmitting the counter input signal; and a direct reset for resetting said output of said transparent latch;

an SR flip-flop with an S input to receive the timer count enabling/inhibiting signal, an R input to receive the timer input signal, and an output transmitted to said gate input of said transparent latch; and a delay circuit with a first input to receive the system clock signal, a second input to receive said output of said SR flip-flop, and an output connected to said direct reset of said transparent latch, said delay circuit being able to reset said transparent latch one clock pulse after the timer count enabling/inhibiting signal becomes inhibited thus ensuring that the counter input signal will always be at least one clock pulse long when the timer count enabling/inhibiting signal becomes inhibited immediately after said transparent latch receives a timer input signal that was active and ensuring that said transparent latch will be reset and ready to receive the timer input signal when the timer count enabling/inhibiting signal again becomes enabled.

2. The timer input control circuit of claim 1 wherein said delay circuit comprises a two input OR gate.

3. A timer input control circuit configured to accept a counter write signal, a timer count enabling/inhibiting signal that is synchronized with a system clock and a timer input signal that is not synchronized with the system clock, and configured to output a counter input signal that is always of sufficient duration to be recognized as a count input to a counter, said timer input control circuit comprising:

a transparent latch having a data input to receive the timer input signal; a gate input to latch said transparent latch when the timer count enabling/inhibiting signal is inhibited and unlatch said transparent latch, thus putting it in transparent mode, when the timer count enabling/inhibiting signal is enabled and the timer input signal is inactive, thus eliminating voltage spikes that could cause timer malfunction; an output for transmitting the counter input signal; and a direct reset for resetting said output of said transparent latch;

an SR flip-flop with a first S input to receive the counter write signal, a second S input to receive the timer count enabling/inhibiting signal, an R input to receive the timer input signal, and an output transmitted to said gate input of said transparent latch; and a delay circuit with a first input to receive the system clock signal, a second input to receive said output of said SR flip-flop, and an output connected to said direct reset of said transparent latch, said delay circuit being able to reset said transparent latch one clock pulse after the timer count enabling/inhibiting signal becomes inhibited thus ensuring that the counter input signal will always be at least one clock pulse wide when the timer count enabling/inhibiting signal becomes inhibited immediately after said transparent latch receives a timer input signal that is active and ensuring that said transparent latch will be reset and ready to receive the timer input signal when the timer count enabling/inhibiting signal again becomes enabled.

4. The timer input control circuit of claim 3 wherein said delay circuit comprises a two input OR gate and a two input AND gate.

5. A counter control circuit comprising:

(a) A timer input control circuit configured to accept a counter write signal, a timer count enabling/inhibiting signal that is synchronized with a system clock and a timer input signal that is not synchronized with the system clock, and configured to output a counter input signal that is always of sufficient duration to be recognized as a count input to a counter, wherein said timer input control circuit comprises:

i) a transparent latch having a data input to receive the timer input signal; a gate input to latch said transparent latch when the timer count enabling/inhibiting signal is inhibited and unlatch said transparent latch, thus putting it in transparent mode, when the timer count enabling/inhibiting signal is enabled and the timer input signal is inactive thus eliminating voltage spikes that could cause timer malfunction; an output for transmitting the counter input signal; and a direct reset for resetting said output of said transparent latch;

ii) an SR flip-flop with a first S input to receive the counter write signal, a second S input to receive the timer count enabling/inhibiting signal, an R input to receive the timer input signal, and an output transmitted to said gate input of said transparent latch; and iii) a delay circuit with a first input to receive the system clock signal, a second input to receive said output of said SR flip-flop, and an output connected to said direct reset of said transparent latch, said delay circuit being able to reset said transparent latch one clock pulse after the timer count enabling/inhibiting signal becomes inhibited thus ensuring that the counter input signal will always be at least one clock pulse wide when the timer count enabling/inhibiting signal becomes inhibited immediately after said transparent latch receives a timer input signal that is active and ensuring that said transparent latch will be reset and ready to receive the timer input signal when the timer count enabling/inhibiting signal again becomes enabled;

(b) a counter having an input to receive the counter input signal;

(c) a reload register having an output buffer for loading an initial value into the counter according to the counter write signal;

(d) a read register having an output buffer for taking out a value of the counter and outputting the value to a data bus, said read register having a gate input and an input to enable and disable said output buffer; and (e) a second SR flip-flop with an S input to receive the counter input signal, an R input to receive a counter read signal, and an output connected to said input of said read register that enables and disables said output buffer.

6. The counter control circuit of claim 5 wherein said delay circuit comprises a two input OR gate and a two input AND gate.

* * * * *